US007244642B2

(12) United States Patent
Vitale et al.

(10) Patent No.: US 7,244,642 B2
(45) Date of Patent: Jul. 17, 2007

(54) METHOD TO OBTAIN FULLY SILICIDED GATE ELECTRODES

(75) Inventors: Steven A. Vitale, Murphy, TX (US); Hyesook Hong, Allen, TX (US); Freidoon Mehrad, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/228,902

(22) Filed: Sep. 16, 2005

(65) Prior Publication Data

US 2007/0066007 A1    Mar. 22, 2007

(51) Int. Cl.
 H01L 21/337   (2006.01)
 H01L 21/336   (2006.01)
 H01L 21/8234  (2006.01)
 H01L 21/8238  (2006.01)
 H01L 21/469   (2006.01)
 H01L 21/31    (2006.01)

(52) U.S. Cl. .................. 438/197; 438/195; 438/196; 438/176; 438/181; 438/184; 438/217; 438/257; 438/267; 438/585; 438/595; 438/265; 438/514; 438/630; 438/721; 438/780; 257/E21.626; 257/E21.575; 257/E21.242

(58) Field of Classification Search ................ 438/195, 438/197, 176, 181, 184–185, 217, 257, 267, 438/265, 585, 587, 595, 514, 630, 721
See application file for complete search history.

(56) References Cited

U.S. PATENT DOCUMENTS 5,429,969 A * 7/1995 Chang ..................... 438/267
5,494,838 A * 2/1996 Chang et al. ............. 438/264
6,225,155 B1 * 5/2001 Lin et al. .................. 438/238
6,277,692 B1 * 8/2001 Chiu ......................... 438/264
6,329,225 B1 * 12/2001 Rodder ..................... 438/151
6,825,523 B2 * 11/2004 Caprara et al. ........... 257/314
7,025,946 B2 * 4/2006 Suematsu et al. ......... 423/594.1
7,045,448 B2 * 5/2006 Nakajima .................. 438/585
7,052,946 B2 * 5/2006 Chen et al. ................ 438/199
2007/0010062 A1 * 1/2007 Mehard et al. ............ 438/305

* cited by examiner

Primary Examiner—Michael Lebentritt
Assistant Examiner—Mohsen Ahmadi
(74) Attorney, Agent, or Firm—Peter K. McLarty; W. James Brady, III; Frederick J. Telecky, Jr.

(57) ABSTRACT

The present invention provides a method of fabricating a microelectronics device. In one aspect, the method comprises depositing a protective layer (510) over a spacer material (415) located over gate electrodes (250) and a doped region (255) located between the gate electrodes (250), removing a portion of the spacer material (415) and the protective layer (510) located over the gate electrodes (250). A remaining portion of the spacer material (415) remains over the top surface of the gate electrodes (250) and over the doped region (255), and a portion of the protective layer (510) remains over the doped region (255). The method further comprises removing the remaining portion of the spacer material (415) to form spacer sidewalls on the gate electrodes (250), expose the top surface of the gate electrodes (250), and leave a remnant of the spacer material (415) over the doped region (255). Source/drains are formed adjacent the gate electrodes 250 and through the remnant of the spacer material (415), and a metal is incorporated into the gate electrodes (250).

15 Claims, 7 Drawing Sheets

METHOD TO OBTAIN FULLY SILICIDED GATE ELECTRODES

TECHNICAL FIELD OF THE INVENTION

The present invention is directed in general to a method for manufacturing a microelectronics device, and more specifically, to a method of achieving a fully silicided poly gate.

BACKGROUND

Metal gate electrodes are currently being investigated to replace polysilicon gate electrodes in today's ever shrinking and changing transistor devices. One of the principle reasons the industry is investigating replacing the polysilicon gate electrodes with metal gate electrodes is to solve problems of poly-depletion effects and boron penetration for future CMOS devices. Traditionally, a polysilicon gate electrode with an overlying silicide was used for the gate electrodes in CMOS devices. However, as device feature sizes continue to shrink, poly depletion and gate sheet resistance become serious issues when using polysilicon gate electrodes.

Accordingly, metal gates have been proposed. However, in order to optimize the threshold voltage ($V_t$) in high-performance devices, the metal gates need tunable work functions. For instance, the metal gates need tunable work functions for NMOS and PMOS devices similar to present polysilicon gate technology, requiring the work functions of metal gates to range from 4.1~4.4 eV for NMOS and 4.8~5.1 eV for PMOS (see, B. Cheng, B. Maiti, S. Samayedam, J. Grant, B. Taylor, P. Tobin, J. Mogab, *IEEE Intl. SOI Conf. Proc.*, pp. 91-92, 2001).

Recently, silicided metal gates have been investigated based on the extension of existing self-aligned silicide (SALICIDE) technology. In this approach, polysilicon is deposited over the gate dielectric. A metal is deposited over the polysilicon and reacted to completely consume the polysilicon resulting in a fully silicided metal gate, rather than a deposited metal gate. The silicided metal gate provides a metal gate with the least perturbation to the conventional process and avoids contamination issues. Furthermore, poly doping has been shown to affect the work function of the silicided metal gates.

Complications can arise, however, during the silicidation process. For example, in some conventional processes, an etch is conducted prior to the silicidation process to form sidewall spacers, which can expose substrate regions between adjacent transistors to the silicidation process. In such instances, the silicidation process can extended deeply into the moat region, which in turn, can cause shorts to occur in the device.

Accordingly, what is needed in the art is a silicidation process that avoids the deficiencies of the conventional processes discussed above.

SUMMARY OF INVENTION

To overcome the deficiencies in the prior art, the present invention, in one embodiment, provides a method of fabricating a microelectronics device. In one embodiment, the method comprises depositing a protective layer over a spacer material that is located over gate electrodes and a doped region that is located between the gate electrodes and removing a portion of the spacer material and the protective layer that are located over the gate electrodes. A remaining portion of the spacer material is left over the top surface of the gate electrodes and over the doped region, and a portion of the protective layer remains over the doped region. This embodiment further comprises removing the remaining portion of the spacer material to form spacer sidewalls on the gate electrodes, expose the top surface of the gate electrodes, and leave a remnant of the spacer material over the doped region. Source/drains are formed adjacent the gate electrodes and through the remnant of the spacer material, and a metal is incorporated into the gate electrodes.

Another embodiment provides a method of fabricating an integrated circuit. This method comprises forming transistors that have silicided gate electrodes and that are located over a microelectronics substrate. The method of forming the silicided gate electrodes comprises creating a doped region between gate electrodes, depositing spacer material over the gate electrodes, depositing a protective layer over the gate electrodes and the doped region, removing a portion of the spacer material and the protective layer located over the gate electrodes. A remaining portion of the spacer material remains over the top surface of the gate electrodes and over the doped region, and a portion of the protective layer remains over the doped region. The remaining portion of the spacer material is removed to form spacer sidewalls on the gate electrodes, expose the top surface of the gate electrodes, and leave a remnant of the spacer material over the first doped region. Source/drains are formed adjacent the gate electrodes and through the remnant of the spacer material, and metal is incorporated into the gate electrodes. Dielectric layers are formed over the gate electrodes, and interconnects are formed in the dielectric layers to electrically connect the transistors to form an operative integrated circuit.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGS. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
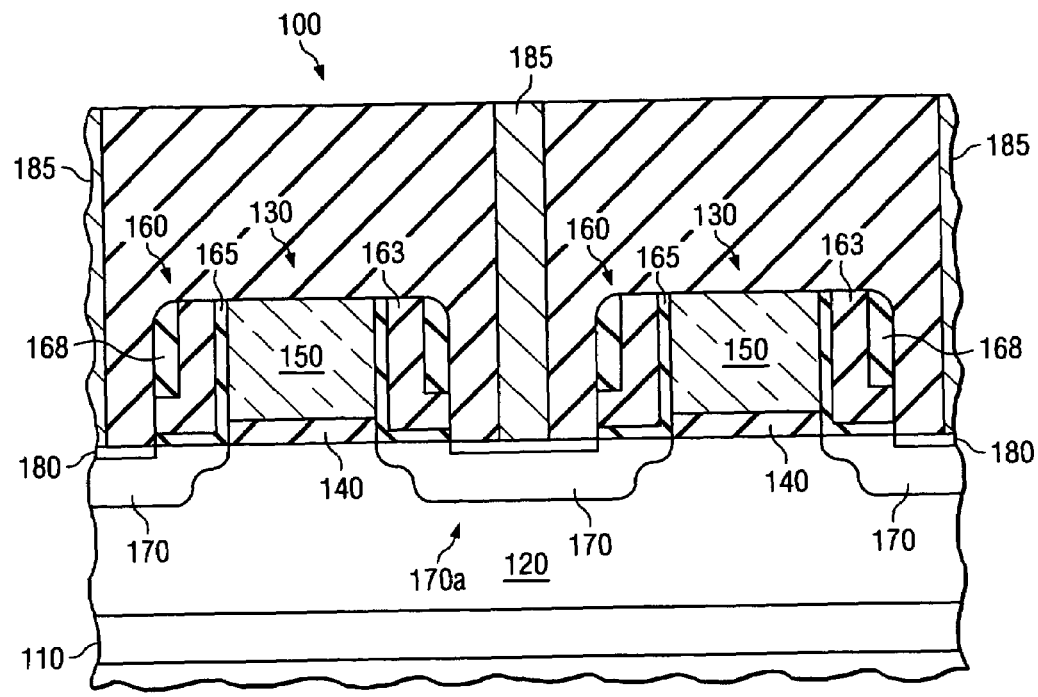
FIG. 1 illustrates a partial sectional view of one embodiment of a microelectronics device, as provided by the present invention.

Turning initially to FIG. 1, there is illustrated a partial sectional view of one embodiment of a microelectronics device 100, as provided by the present invention. The microelectronics device 100 includes a substrate 110. Located within the substrate 110 in the embodiment of FIG. 1 is a well region 120. Located over the substrate 110 and well region 120 are gate structures 130.

The gate structures 130 illustrated in FIG. 1 each include a gate oxide 140 located over the substrate 110, as well as a fully silicided gate electrode 150 located over the gate oxide 140. The silicided gate electrode 150 may have a variety of thicknesses, although a thickness ranging from about 50 nm to about 150 nm is exemplary. The silicided gate electrode 150, when constructed in accordance with the principles of the present invention, may comprise a number of different materials. For instance, in the illustrative embodiment shown in FIG. 1 the silicided gate electrode 150 comprises nickel, however, it is envisioned that the silicided gate electrode 150 could comprise cobalt, platinum, titanium, tantalum, molybdenum, tungsten, etc., while staying within the scope of the present invention.

The silicided gate electrode 150 may also include a dopant or combination of several types of dopants therein. The dopant, such as boron, phosphorous, arsenic or another similar dopant based on whether the semiconductor device 100 is operating as a PMOS device or an NMOS device is configured to tune the minimum energy required to bring an electron from the Fermi level to the vacuum level, or the so called work function.

The gate structures 130 further contain gate sidewall spacers 160 flanking both sides of the silicided gate electrodes 150 and gate oxide 140. The gate sidewall spacers 160 in the embodiment of FIG. 1 may each include one or more different layers. For instance the gate sidewall spacers 160 may also include nitride spacers 163 and sidewall oxides 165 and 168. The gate sidewall spacers 160 may comprise many different types and numbers of layers while staying consistent with the principles of the present invention.

The microelectronics device 100 illustrated in FIG. 1 additionally includes conventional source/drain 170 located within the substrate 110 and proximate the gate oxide 140 and within a moat region 170a located between the gate electrodes 150. Located within the source/drains 170 are silicided source/drain contacts 180. The silicided source/drain contacts 180 in this embodiment comprise nickel silicided source/drain contacts 180. Nonetheless, other silicidation materials could be used to form the silicided source/drain contacts 180 and remain within the scope of the present invention. The silicided source/drain contacts 180 may have a depth into the source/drains 170 ranging from about 10 nm to about 30 nm, among others.

Figure 2:
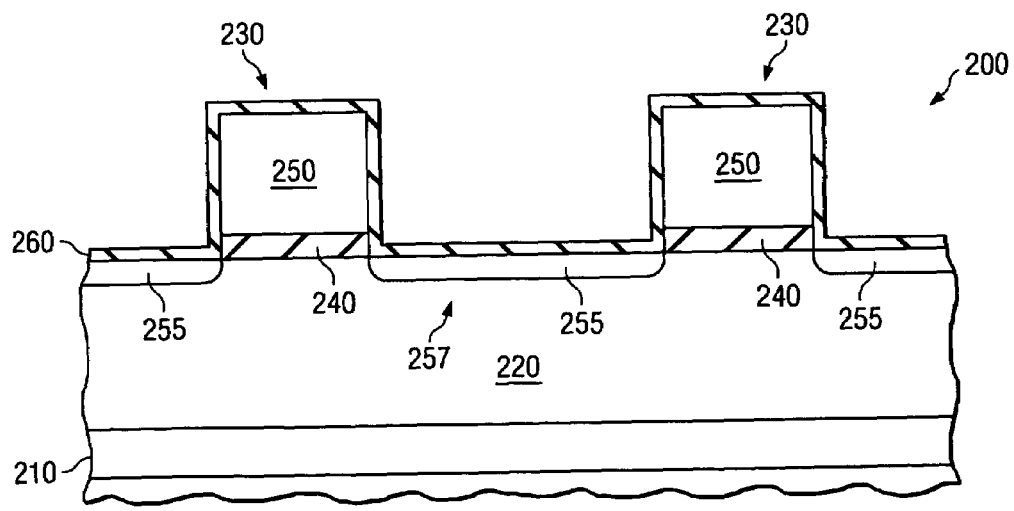
FIG. 2 illustrates a partial sectional view of a partially completed microelectronics device manufactured in accordance with the principles of the present invention and as discussed with respect to FIG. 1 after the conventional deposition of a first layer of a spacer material.

Turning now to FIGS. 2-12, illustrated are sectional views of detailed manufacturing steps instructing how one might, in an advantageous embodiment, manufacture a microelectronics device similar to the microelectronics device 100 depicted in FIG. 1. FIG. 2 illustrates a sectional view of a partially completed microelectronics device 200 manufactured in accordance with the principles of the present invention. The partially completed semiconductor device 200 of FIG. 2 includes a substrate 210. The substrate 210 may, in an exemplary embodiment, be any layer located in the partially completed semiconductor device 200, including a wafer itself or a layer located above the wafer (e.g., epitaxial layer). In the embodiment illustrated in FIG. 2, the substrate 210 is a P-type substrate; however, one skilled in the art understands that the substrate 210 could be an N-type substrate without departing from the scope of the present invention. In such cases, each of the dopant types described throughout the remainder of this document would be reversed. For clarity, no further reference to this opposite scheme will be discussed. The substrate may be any type of material known to those who are skilled in the art of manufacturing microelectronic devices, such as silicon or silicon germanium.

Located within the substrate 210 in the embodiment shown in FIG. 2 is a well region 220. The well region 220, in light of the P-type semiconductor substrate 210, would more than likely contain an N-type dopant. For example, the well region 220 would likely be doped with an N-type dopant dose ranging from about 1E13 atoms/cm$^2$ to about 1E14 atoms/cm$^2$ and at a energy ranging from about 100 keV to about 500 keV. This results in the well region 220 having a peak dopant concentration ranging from about 5E17 atoms/cm$^3$ to about 1E19 atoms/cm$^3$.

Located over the substrate 210 in the embodiment of FIG. 2 are gate structures 230. The gate structures 230 each includes a gate oxide 240 and a gate electrode 250, which in a preferred embodiment, may be comprised of polysilicon.

The gate oxide 240 may comprise a number of different materials and stay within the scope of the present invention. For example, the gate oxide 240 may comprise silicon dioxide, or in an alternative embodiment comprise a high dielectric constant (K) material. In the illustrative embodiment of FIG. 2, however, the gate oxide 240 is a silicon dioxide layer having a thickness ranging from about 0.5 nm to about 5 nm.

Any one of a plurality of well known manufacturing techniques could be used to form the gate oxide 240. For example, the gate oxide 240 may be grown. Additionally, the growth step may require a significant number of different temperatures, pressures, gasses, flow rates, etc., all of which are well known to those who are skilled in the art.

In addition to polysilicon, the gate electrodes, in other embodiments may comprise amorphous polysilicon. The amorphous polysilicon embodiment may be particularly useful when a substantially planar upper surface of the polysilicon gate electrode is desired.

The deposition conditions for the gate electrodes 250 may vary, however, if the gate electrodes 250 were to comprise standard polysilicon, such as the instance in FIG. 2, the gate electrodes 250 could be deposited using a pressure ranging from about 100 torr to about 300 torr, a temperature ranging from about 620° C. to about 700° C., and a $SiH_4$ or $Si_2H_6$ gas flow ranging from about 50 sccm to about 150 sccm. If, however, amorphous polysilicon were desired, the amorphous polysilicon gate electrode could be deposited using a pressure ranging from about 100 torr to about 300 torr, a temperature ranging from about 450° C. to about 550° C., and a $SiH_4$ or $Si_2H_6$ gas flow ranging from about 100 sccm to about 300 sccm. In any instance, the gate electrodes 250 desirably have a thickness ranging from about 50 nm to about 150 nm, and in one embodiment, the thickness is about 80 nm. Conventional blanket deposition and patterning processes may be used to form the gate electrodes 250 and gate oxides 240. Following the patterning of the gate electrodes 250 and gate oxides 240, medium doped drain (MDD) regions 255 are conventionally formed adjacent the gate electrodes 250 and in the moat region 257 between the gate electrodes 250. It should be understood that other device configurations may not include the moat region 257, but may have, in its place a trench isolation structure that separates two different source/drains. The principles of the present invention are also applicable to these and other structures as well. The MDD regions 255 are conventionally formed and doped, and in one example, generally have a peak dopant concentration ranging from about $1E19$ atoms/cm$^3$ to about $2E20$ atoms/cm$^3$. As is standard in the industry, the MDD regions 255 have a dopant type opposite to that of the well region 220 they are located within.

The partially completed semiconductor device 200 illustrated in FIG. 2 further includes a conventionally deposited first layer 260 located over the gate electrodes 250, resulting in capped gate electrodes 250. Conventional processes, such as chemical vapor deposition, may also be used to form the first layer 260 over the gate electrodes 250. The first layer 260, which preferably comprises an oxide, is designed to help protect the regions adjacent the gate electrodes 250 during subsequent processing steps, after the formation of the gate electrodes 250. Moreover, this layer preferably forms a portion of a sidewall spacer, as discussed below. The thickness of the first layer 260 may vary. For example, its thickness can range from about 10 nm to about 300 nm, but in one advantageous embodiment, the thickness may be about 15 nm.

Figure 3:
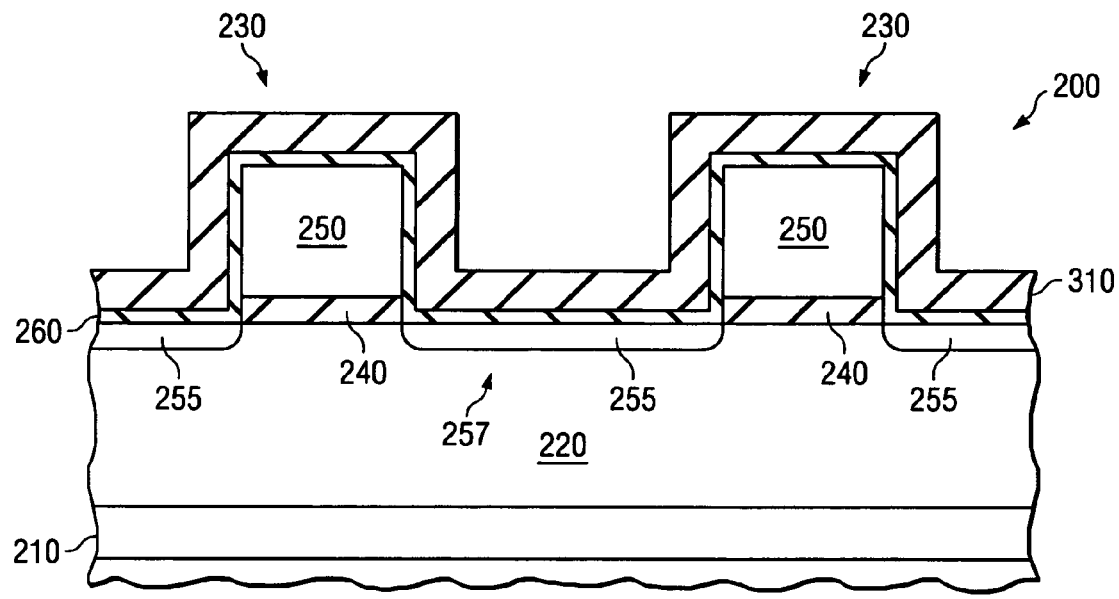
FIG. 3 illustrates a partial sectional view of the partially completed microelectronics device illustrated in FIG. 2 after the conventional deposition of second layer of the spacer material.

Turning briefly to FIG. 3 illustrated is a sectional view of the partially completed microelectronics device 200 illustrated in FIG. 2 after the conventional deposition of a second layer 310. The second layer 310, in an advantageous embodiment, may comprise a standard silicon nitride or a silicon nitride layer having carbon therein. If the second layer 310 were to contain the carbon, the carbon might form from about 5% to about 10% of the layer. The thickness of the second layer 310 may also vary, depending on design. However, in an advantageous embodiment, the second layer 310 has a thickness of about 80 nm and is deposited using a silane and nitrogen gas mixture. The second layer 310 is etched to form a portion of the sidewall spacer on each side of the gates, as discussed below.

Figure 4:
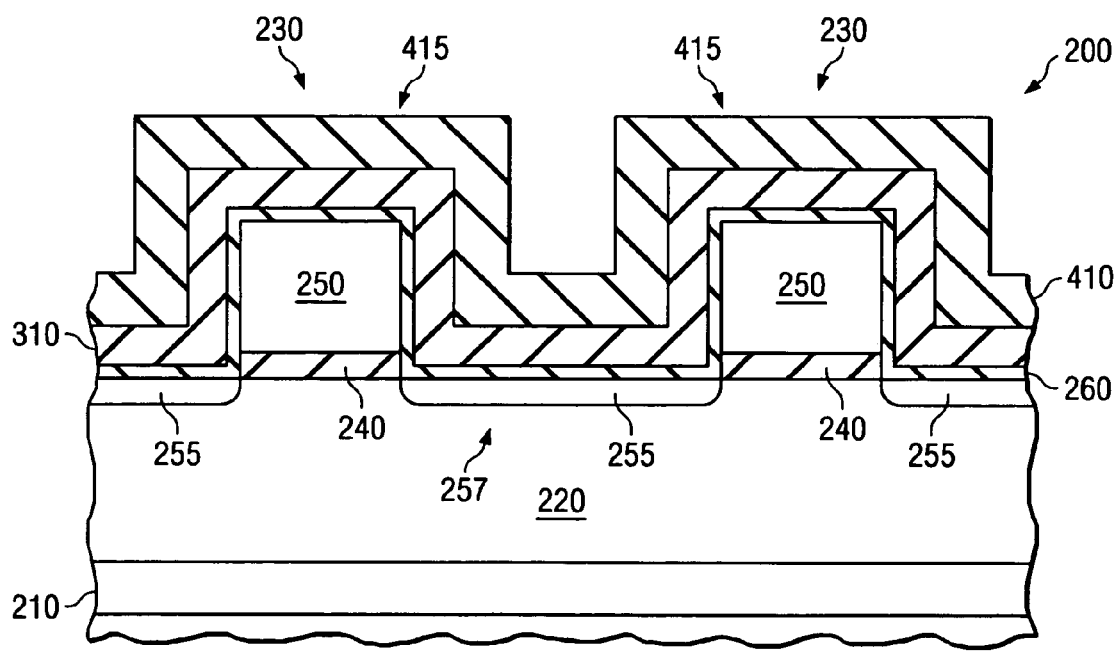
FIG. 4 illustrates a partial sectional view of the partially completed microelectronics device illustrated in FIG. 3 after the conventional deposition of a third layer of a spacer material.

Referring briefly now to FIG. 4, there is shown a sectional view of the partially completed microelectronics device 200 illustrated in FIG. 3 after the conventional deposition of a third layer 410, which in a preferred embodiment is also an oxide layer that may be formed from tetra-ortho silicate. The third layer 410 is conformably deposited over the second layer 310, and its thickness may range from about 100 nm to about 150 nm. Together, the first layer 260, the second layer 310, and the third layer 410 form a spacer material 415 from which sidewall spacers will ultimately will be formed. While only three different layers have been illustrated and discussed in the foregoing embodiments, it should be understood that the number of layers may vary, and certain embodiments, may include one, two, or more than three layers. Moreover, it should be understood that any one or more of the layers may form the spacer material 415 that can be etched to form sidewall spacers for the gate electrodes 250.

Figure 5:
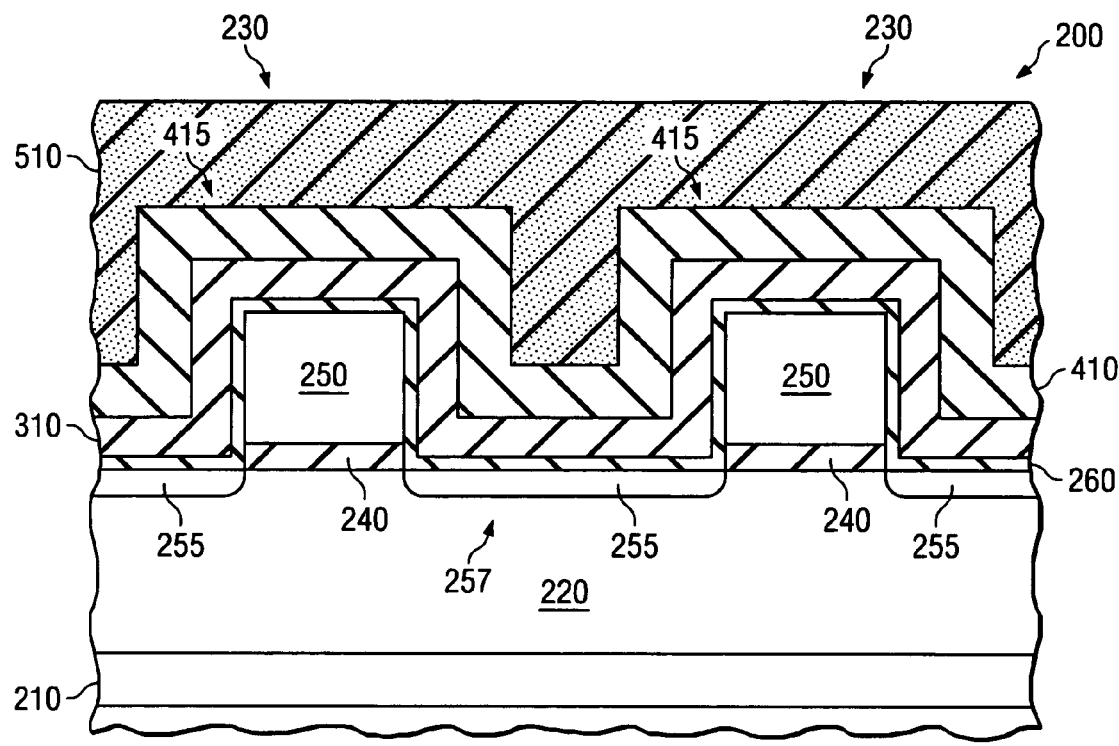
FIG. 5 illustrates a partial sectional view of the partially completed microelectronics device illustrated in FIG. 4 after the conventional deposition of a protective layer.

Turning now to FIG. 5, there is illustrated a partial sectional view of the partially completed microelectronics device 200 illustrated in FIG. 4 the deposition of a protective layer 510. In one aspect, the protective layer is a bottom anti-reflective coating (BARC) layer. The BARC layer may be comprised. of conventional materials, such as an organic polymer. Typically such layers are spin coated, which results in a non-conformal and substantially planar surface. The protective layer 510 overlies the spacer material 415, the gate electrodes 250, and the doped regions 255. It should be noted that the protective layer 510 is much thicker over the doped regions 255 than it is over the top of the gate electrodes 250. The presence of the protective layer 510 affords the third layer 310 protection from subsequent processing steps.

Figure 6:
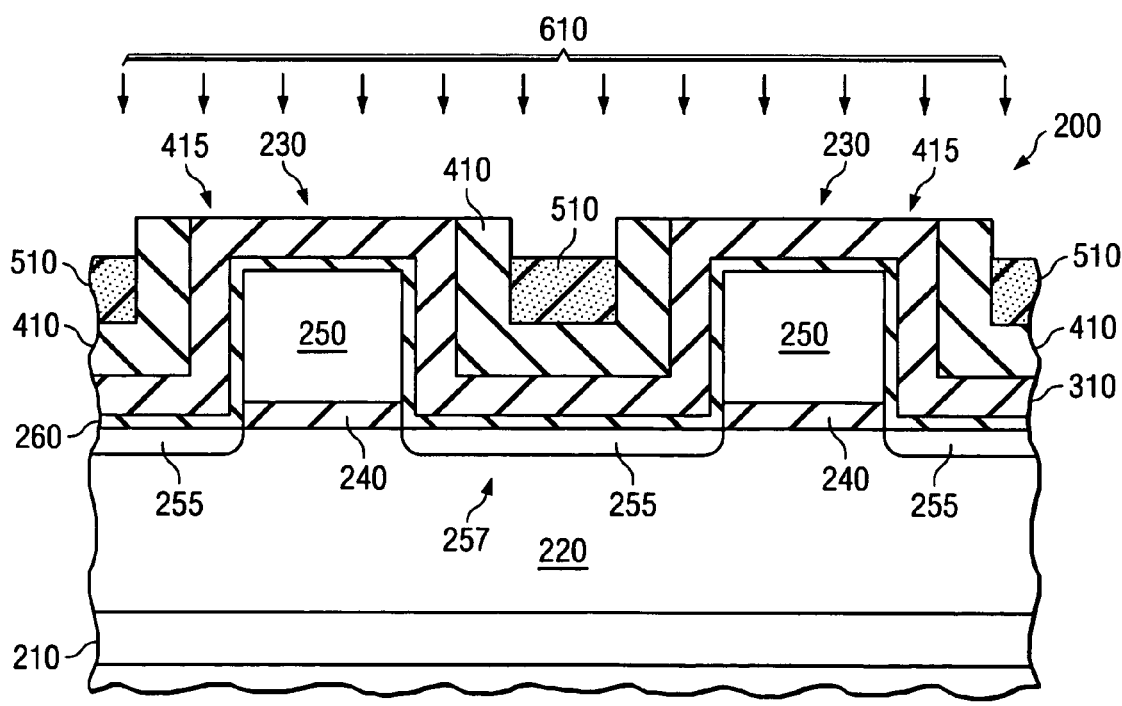
FIG. 6 illustrates a partial sectional view of the partially completed microelectronics device illustrated in FIG. 5 following an initial etch of the spacer material and the protective layer wherein a portion of the spacer material and protective layer are left over a doped region.

Referring now to FIG. 6, there is illustrated a partial sectional view of the partially completed microelectronics device 200 illustrated in FIG. 5 following an initial etch 610 of the spacer material 415 and the protective layer 510. In those embodiments, where the spacer material 415 is comprised of multiple layers of differing materials, the etch is chosen such that it is selective to and will stop on the second layer 310, which, in the illustrated embodiment, is a nitride layer. Of course, in those embodiments where the spacer material 415 is a single layer, the etch is conducted for an abbreviated period of time to leave a portion of the spacer material 415 over the top surface of the gate electrodes 250. The etch 610 removes the portion of the protective layer 510 and the spacer material layer 415 that are located over the top surface of the gate electrodes 250 and leaves remaining portions of both the spacer material 415 and the protective layer 510 over the doped regions 255, as illustratively shown.

In those embodiments where the protective layer 510 is a BARC layer, the etch 610 may remove the BARC layer at a slightly faster rate than it removes the third layer 310. Whatever the composition of the protective layer 510 and the etch rate, however, it is preferred that a substantial portion of the protective layer 510 remains over the spacer material 415 located over the doped regions 255 upon completion of the etch. Due to the greater thickness of the protective layer 510 over the doped regions 255, the protective layer 510 protects the underlying spacer material 415 in those regions and substantially inhibits or prevents its removal during subsequent etching processes. In an advantageous embodiment, the etch is a conventional plasma etch that is capable of etching the spacer material 415 in the appropriate manner as discussed herein. An exemplary plasma etch comprises a two 2 step process wherein the first step involved removing the protective layer 510, followed by the removal of the sidewall layer 410. Additionally, an overetch step may follow each main etch step. An exemplary protective layer etch includes some or all of the following gases: chloride gas ($Cl_2$), hydrogen bromide HBr, bromine ($Br_2$), oxygen ($O_2$), argon (Ar), helium (He) or nitrogen ($N_2$). An exemplary flow rate for the etch used to remove the protective layer 510 for all the gases used may range from about 50 sccm to about 500 sccm, at a pressure ranging from about 1 mT to about 70 mT, at a wafer temperature ranging from about 0° C. to about 70° C. The plasma etcher configuration may be an inductively coupled plasma, a capacitively coupled plasma, or an electron cyclotron resonance plasma. An exemplary etch used to etch the sidewall layer 410 includes some or all of the gases: a hydrofluorocarbon ($C_xH_yF_z$), O2, Ar, He, or N2. A total flow rate of the gases that are used may range from about 50 sccm to about 500 sccm, at a pressure ranging from about 1 mT to about 70 mT, a wafer temperature ranging from about 0° C. to about 70° C. The plasma etcher configuration may be an inductively coupled plasma, a capacitively coupled plasma, or an electron cyclotron resonance plasma.

Figure 7:
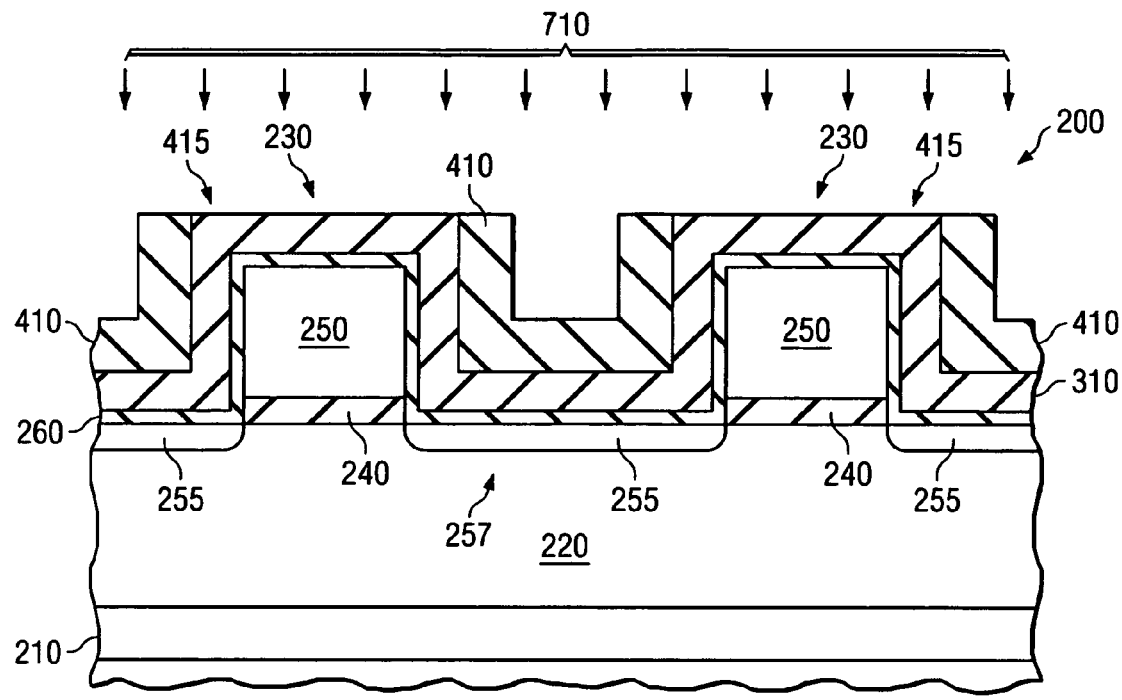
FIG. 7 illustrates a partial sectional view of the partially completed microelectronics device illustrated in FIG. 6 following the removal of the remaining portions of the protective layer.

Turning briefly to FIG. 7, there is illustrated a partial sectional view of the microelectronics device 200 of FIG. 6 following the removal of the remaining portions of the protective layer 510. The remaining portions of the protective layer 510 may be removed with a conventional strip chemistry 710 to arrive at the exemplary device shown in FIG. 7. Since, the spacer material 415 located over the doped regions 255 was protected by the protective layer 510 during the initial etch steps, its full thickness remains such that a remnant of the spacer material 415 may be left over the doped regions 255 after additional etching steps as discussed below. This allows the doped regions 255 to remain protected from a silicidation process.

Figure 8:
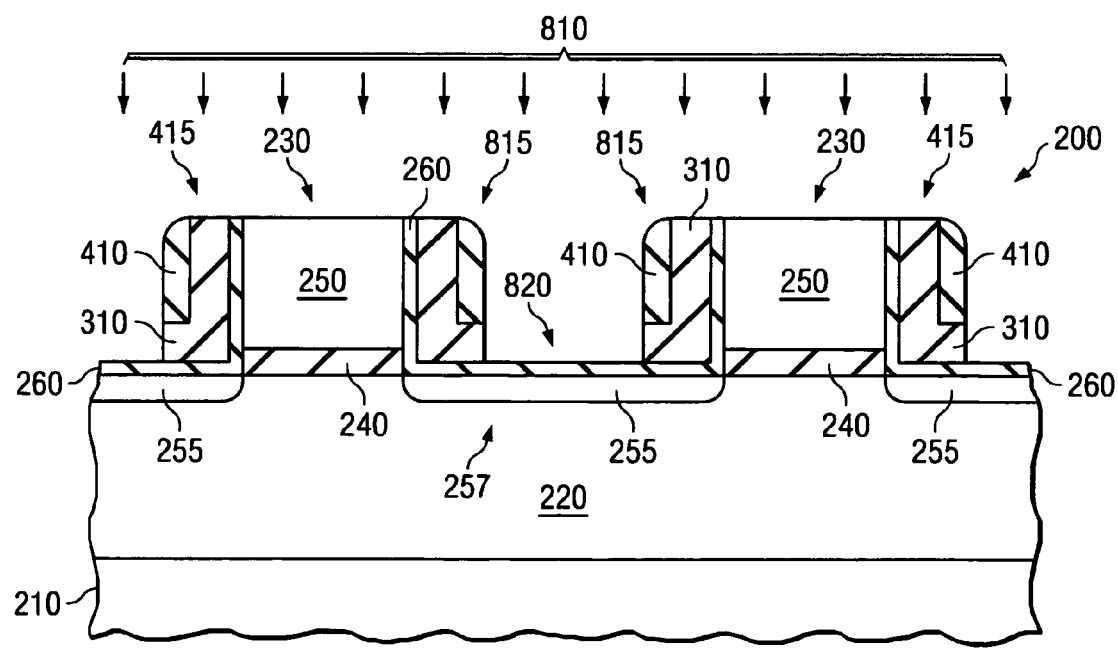
FIG. 8 illustrates a partial sectional view of the partially completed microelectronics device illustrated in FIG. 7 following a conventional etch of the spacer material to form sidewall spacer, wherein a remnant of the spacer material is left over the doped region.

Turning now to FIG. 8, a conventional anisotropic etch 810 is conducted to remove remaining portions of the material layer 415 to form sidewall spacers 815 located adjacent the gate electrodes 250, with the exception that a remnant 820 of the spacer material, which in the illustrated embodiment is the first layer 260, remains over the doped regions 255. Preferably, the remnant 820 covers all doped regions, including the one located within the moat region 257. The remnant 820 serves to protect the covered regions from a subsequent silicidation process. Due to the fact that more of the spacer material 415 resides over the doped regions 255 than resides over the top of the gate electrodes 250, the etch can be better more effectively controlled to cause the remnant 820 to remain over the doped regions 255.

Figure 9:
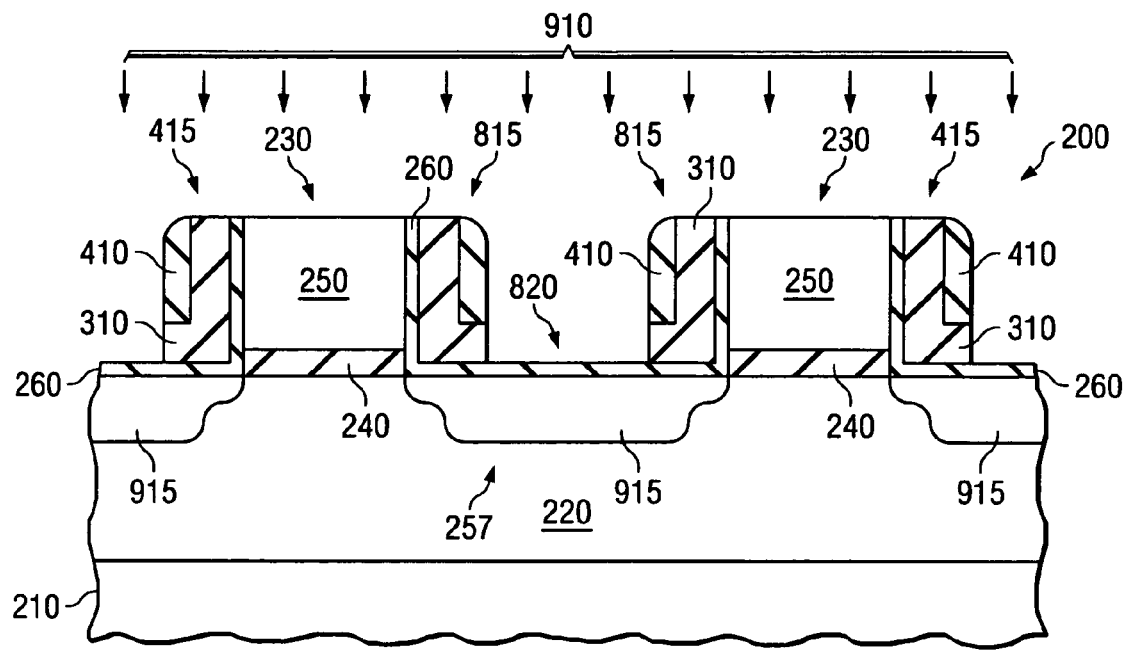
FIG. 9 illustrates a partial sectional view of the partially completed microelectronics device illustrated in FIG. 8 following a conventional source/drain implant.

Referring now to FIG. 9, following the etch 810 discussed above, a conventional source/drain implant 910 is conducted to form source/drains 915. It should be noted that the source/drain implant 910 is conducted through the remnant 820 of the material layer 415. Generally the source/drain implant 910 involves a high dopant concentration that has a peak dopant concentration ranging from about 1E18 atoms/$cm^3$ to about 1E21 atoms/$cm^3$. Also, the highly doped source/drain implant should typically have a dopant type opposite to that of the well region 220 they are located within. Following the source/drain implant 910, a standard source/drain anneal is conducted to activate the source/drain 915. It is believed that a source/drain anneal conducted at a temperature ranging from about 1000° C. to about 1100° C. and a time period ranging from about 1 second to about 5 seconds would be sufficient. It should be noted that other temperatures, times, and processes could be used to activate the source/drains 915 and such processes are known to those skilled in the art.

Figure 10:
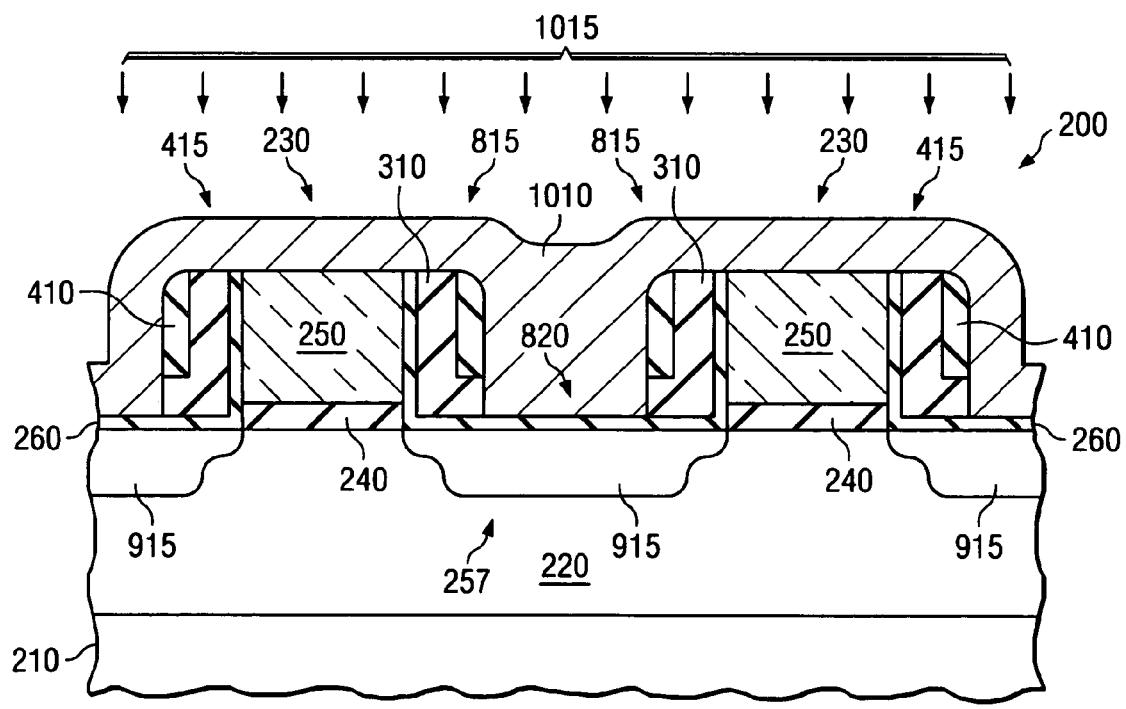
FIG. 10 illustrates a partial sectional view of the partially completed microelectronics device illustrated in FIG. 9 following the conventional deposition of a metal layer over the gate electrodes and the protected doped regions.

FIG. 10 illustrates a partial, sectional view of the microelectronics device 200 of FIG. 9, following the deposition of a metal layer 1010. In an advantageous embodiment, the metal layer 1010 is conventionally deposited over the exposed surfaces of the gate electrodes 250. The thickness of the metal layer 1010 may vary and will depend, in some embodiments, on the thickness of the gate electrodes 250. For example, in one embodiment where the thicknesses of the gate electrodes 250 are about 80 nm thick, the thickness of the metal layer 1010 will be about 60 nm. Preferably, the metal layer 1010 is thick enough such that full silicidation of the gate electrodes 250 occurs. However, in other embodiments, full silicidation may not be necessary. In such cases, the metal layer 1010 may be thinner. A conventional silicidation process 1015 can be conducted until the desired work function of the respective gate electrodes 250 is achieved or the gate electrodes 250 are fully silicided. As shown, the metal layer 1010 covers the doped regions 255 and the moat region 257, as well as the exposed surfaces of the gate electrodes 250, but the doped regions 255 are protected from the metal layer 1010 by the presence of the remnant 820 of the material layer 415.

The metal layer 1010 may be nickel or cobalt or a combination thereof. In those embodiments where the metal layer 1010 is nickel and the gate electrodes 250 comprise polysilicon, an exemplary silicide process comprises placing a blanket of nickel layer over the gate electrodes 250. As it takes approximately 1 nm of nickel to fully silicidize approximately 1.8 nm of polysilicon, the thickness of the blanket layer of nickel should be at least 56% of the thickness of the polysilicon gate electrode 250. To be comfortable, however, it is suggested that the thickness of the layer of nickel should be at least 60% of the thickness of the gate electrodes 250. Thus, where the thickness of the gate electrodes 250 range from about 50 nm to about 150 nm, as described above, the thickness of the blanket layer of nickel should range from approximately 30 nm to about 90 nm. It should also be noted that the blanket layer of silicidation material may comprise a number of different metals or combinations of metals, such as nickel and cobalt, while staying within the scope of the present invention. The nickel layer and the gate electrodes 250 are subjected to a thermal anneal having a temperature ranging from about 400 degrees centigrade to about 600 degrees centigrade and for a period of time ranging from about 10 seconds to about 100 seconds. It should be noted, however, that the silicidation process may vary depending on the amount of silicidation that is desired and the materials that are used to silicide the gate electrodes 250. For example, if the gate electrodes 250 are silicided with a combination of cobalt and nickel, then the silicidation process parameters and percentages of materials used will be different than those just stated above.

Those who are skilled in the art will understand how to achieve the desired degree of silicidation when using such metal combinations.

After fully siliciding the gate electrodes 250, any remaining unreacted metal materials can be removed using conventional processes. It should be noted that the silicide does not form on the moat region 257 at this time because the remnant 820 of the spacer material 415, shown here as the first layer 260 blocks the silicidation process 1015.

Figure 11:
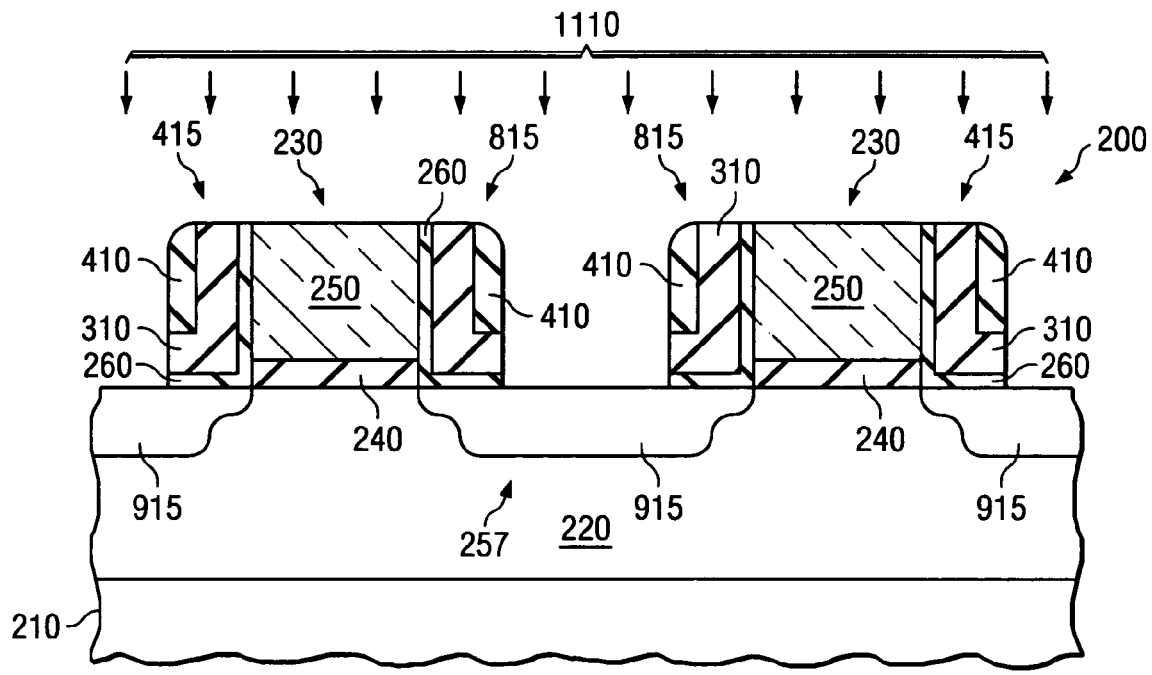
FIG. 11 illustrates a partial sectional view of the partially completed microelectronics device illustrated in FIG. 10 following the silicidation of the gate electrodes and conventional removal of the remnant of the spacer material.

FIG. 11 shows the microelectronics device 200 of FIG. 10 following the silicidation process and removal of the excess metal layer 1010 and further illustrating the silicided gate electrodes 250 and the non-silicidation of the source/drains 915. FIG. 11 also shows the microelectronics device 200 following a conventional etch 1110. The etch 1110 is conducted to remove the remnant 820 of the spacer material (FIG. 10) located over the source/drains 915. The etch, of course, must be selected so as to remove the targeted material. In an exemplary embodiment, the remnant 820 of FIG. 10 will be an oxide. Thus, in such instances, the etch will be a hydrofluoric (HF) etch.

Figure 12:
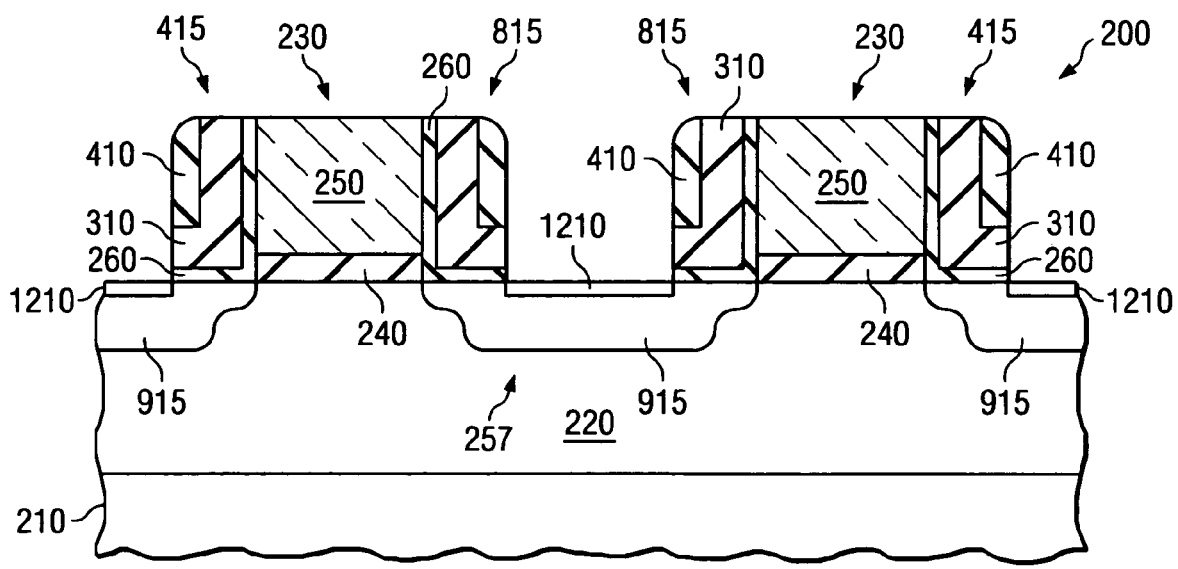
FIG. 12 illustrates a partial sectional view of the partially completed microelectronics device illustrated in FIG. 11 following the conventional formation of silicided contacts over the doped regions.

Following removal of the remnant 820 of FIG. 10, a conventional contact silicidation process is conducted to form contact pads 1210 over the source/drains 815, a shown in FIG. 12. In such conventional processes, a metal layer, such as nickel is deposited over the gate electrodes 250 and the source/drains 915. The nickel layer is then subjected to the appropriate process conditions to cause it to form a silicide within the source/drains 915. Any un-silicided metal that remains can then be removed by conventional processes. A pre-metal dielectric layer and contact plugs are conventionally formed to arrive at the structure illustrated in FIG. 1.

Figure 13:
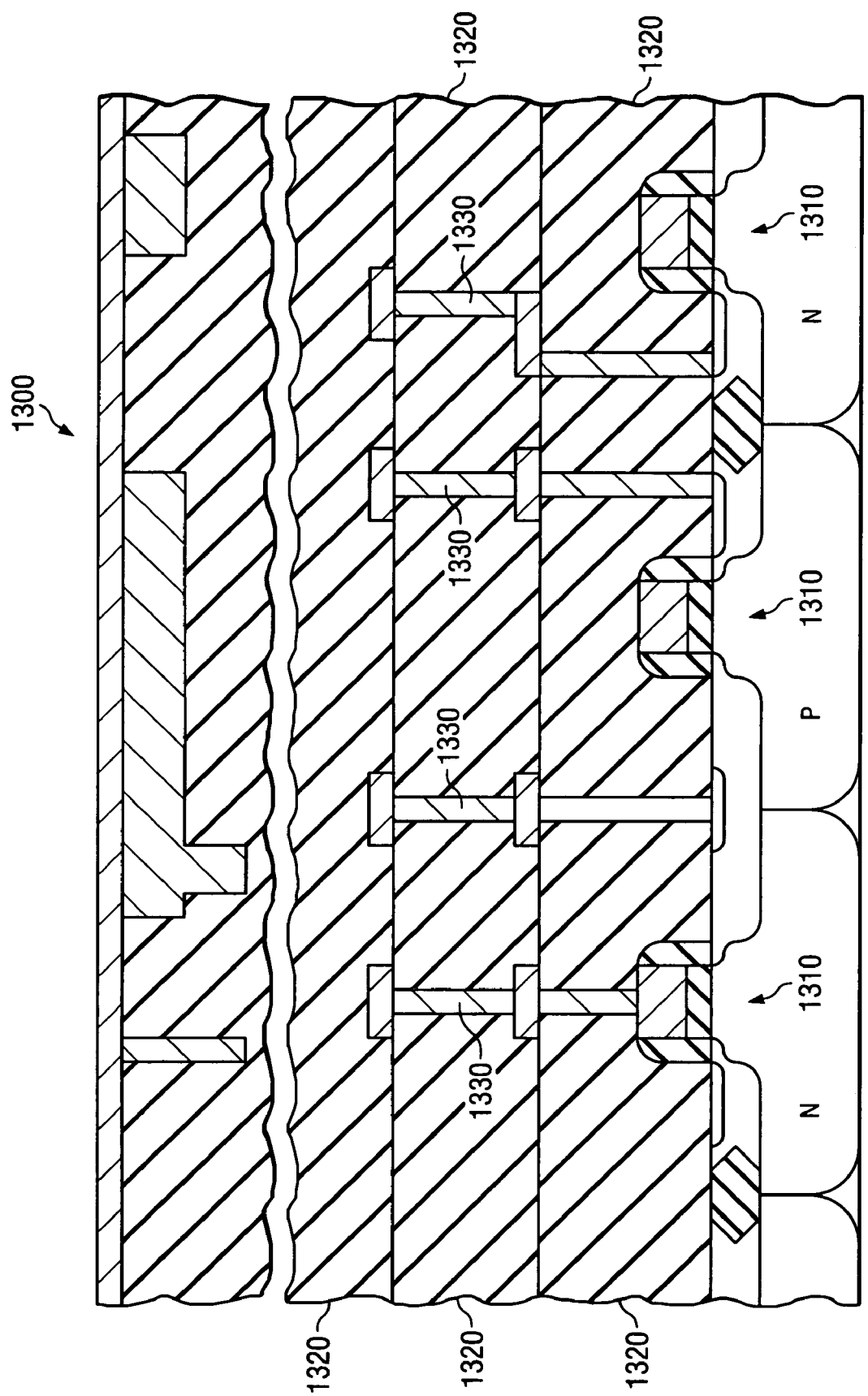
FIG. 13 illustrates an exemplary cross-sectional view of an integrated circuit (IC) incorporating devices constructed according to the principles of the present invention.

Referring finally to FIG. 13, illustrated is an exemplary cross-sectional view of an integrated circuit (IC) 1300 incorporating devices 1310 constructed according to the principles of the present invention. The devices 1310 may include a wide variety of devices, such as transistors used to form CMOS devices, BiCMOS devices, Bipolar devices, as well as capacitors or other types of devices. The IC 1300 may further include passive devices, such as inductors or resistors, or it may also include optical devices or optoelectronic devices. Those skilled in the art are familiar with these various types of devices and their manufacture. In the particular embodiment illustrated in FIG. 13, the devices 1310 are transistors over which dielectric layers 1320 are located, and the transistors include the various components as discussed above. Additionally, interconnect structures 1330 are located within the dielectric layers 920 to interconnect various devices 1310, thus, forming an operational integrated circuit 1300.

Although the present invention has been described in detail, one who is of ordinary skill in the art should understand that they can make various changes, substitutions, and alterations herein without departing from the scope of the invention.

What is claimed is:

1. A method of fabricating a microelectronics device, comprising:
    depositing a protective layer over a spacer material located over gate electrodes and a doped region located between the gate electrodes;
    removing a portion of the spacer material and the protective layer located over the gate electrodes, a remaining portion of the spacer material remaining over the top surface of the gate electrodes and over the doped region, and a portion of the protective layer remaining over the doped region wherein removing a portion of the spacer material and the protective layer comprises plasma etching the spacer material and the protective layer;
    removing the remaining portion of the spacer material to form spacer sidewalls on the gate electrodes, expose the top surface of the gate electrodes, and leave a remnant of the spacer material over the doped region;
    forming source/drains adjacent the gate electrodes and through the remnant of the spacer material; and
    incorporating a metal into the gate electrodes.

2. The method as recited in claim 1, wherein forming a spacer material includes forming a first spacer material layer over the gate electrodes, forming a second spacer material layer over the first oxide layer and forming a third spacer material layer over the second spacer material layer.

3. The method as recited in claim 2, wherein the first spacer material layer is a first oxide layer layer, the second spacer material layer is a nitride layer, and the third spacer material layer is a second oxide layer.

4. The method as recited in claim 3, wherein removing a portion of the spacer material comprises removing a portion of the second oxide layer located over the top surface of the gate electrodes and the method further includes removing the remnant of the spacer material subsequent to incorporating the metal, wherein the remnant comprises a portion of the first oxide layer.

5. The method as recited in claim 1, wherein the protective layer is an organic bottom anti-reflective coating.

6. The method as recited in claim 1, wherein removing the portion of the spacer material includes removing with a plasma etch comprising a gas mixture, wherein the gas is a hydrofluorocarbon, O2, Ar, He, or N2 having a total flow rate ranging from about 50 sccm to about 500 sccm, a pressure ranging from about 1 mT to about 70 mT, and a wafer temperature ranging from about 0° C. to about 70° C., and removing the portion of the protective layer includes removing with a plasma etch comprising a gas mixture, wherein the gas is $Cl_2$, HBr, $Br_2$, $O_2$, Ar, He or $N_2$ having flow rate ranging from about 50 sccm to about 500 sccm, a pressure ranging from about 1 mT to about 70 mT, and a wafer temperature ranging from about 0° C. to about 70° C.

7. The method as recited in claim 1, wherein incorporating metal into the gate electrodes comprises forming silicided gate electrodes.

8. A method of fabricating an integrated circuit, comprising:
    forming transistors that comprise silicided gate electrodes over a microelectronics substrate, comprising;
    creating a doped region between gate electrodes;
    depositing spacer material over the gate electrodes;
    depositing a protective layer over the gate electrodes and the doped region;
    removing a portion of the spacer material and the protective layer located over the gate electrodes, a remaining portion of the spacer material remaining over the top surface of the gate electrodes and over the first doped region, and a portion of the protective layer remaining over the first doped region;
    removing the remaining portion of the spacer material to form spacer sidewalls on the silicided gate electrodes, expose the top surface of the silicided gate electrodes, and leave a remnant of the spacer material over the first doped region;
    forming source/drains adjacent the gate electrodes and through the remnant of the spacer material; and
    incorporating a metal into the gate electrodes;

forming dielectric layers over the transistors; and forming interconnects in the dielectric layers to electrically connect the transistors to form an operative integrated circuit.

9. The method as recited in claim 8, wherein forming a spacer material includes forming a first spacer material layer over the gate electrodes, forming a second spacer material layer over the first spacer material layer and forming a third spacer material layer over the second spacer material layer.

10. The method as recited in claim 9, wherein the first spacer material layer is a first oxide layer, the second spacer material layer is a nitride layer, and the third spacer material layer is a second oxide layer.

11. The method as recited in claim 10, wherein removing a portion of the spacer material comprises removing a portion of the second oxide layer located over the top surface of the gate electrodes and the method further includes removing the remnant of the spacer material subsequent to incorporating the metal, wherein the remnant comprises a portion of the first oxide layer.

12. The method as recited in claim 8, wherein the protective layer is an organic bottom anti-reflective coating.

13. The method as recited in claim 8, wherein removing a portion of the spacer material and the protective layer comprises plasma etching the spacer material and the protective layer.

14. The method as recited in claim 8, wherein removing the portion of the spacer material includes removing with a plasma etch comprising a gas mixture, wherein the gas is a hydrofluorocarbon, O2, Ar, He, or N2 having a total flow rate ranging from about 50 sccm to about 500 sccm, a pressure ranging from about 1 mT to about 70 mT, and a wafer temperature ranging from about 0° C. To about 70° C., and removing the portion of the protective layer includes removing with a plasma etch comprising a gas mixture, wherein the gas is $Cl_2$, HBr, $Br_2$, $O_2$, Ar, He or $N_2$ having flow rate ranging from about 50 sccm to about 500 sccm, a pressure ranging from about 1 mT to about 70 mT, and a wafer temperature ranging from about 0° C. To about 70° C.

15. The method as recited in claim 8, further including forming silicided contacts over the source/drains.

* * * * *